United States Patent [19]
Besser et al.

[11] Patent Number: 5,738,917
[45] Date of Patent: Apr. 14, 1998

[54] PROCESS FOR IN-SITU DEPOSITION OF A TI/TIN/TI ALUMINUM UNDERLAYER

[75] Inventors: Paul R. Besser, Cupertino; Khanh Q. Tran, San Jose, both of Calif.

[73] Assignee: Advanced Micro Devices, Inc., Sunnyvale, Calif.

[21] Appl. No.: 393,625

[22] Filed: Feb. 24, 1995

[51] Int. Cl.$^6$ .................................................. H05H 1/24
[52] U.S. Cl. .................... 427/576; 118/50; 118/723 R; 118/723 VE; 427/250; 427/255.2; 427/294; 427/404; 427/419.7; 427/585; 428/457; 428/698; 428/699; 428/704
[58] Field of Search ............................... 427/576, 585, 427/250, 255.2, 294, 404, 419.7; 118/723 R, 723 VE, 50; 428/457, 698, 699, 704

[56] References Cited

U.S. PATENT DOCUMENTS

| | | | |
|---|---|---|---|
| 4,823,182 | 4/1989 | Okumura | 357/67 |
| 5,240,880 | 8/1993 | Hindman et al. | 437/190 |
| 5,290,731 | 3/1994 | Sugano et al. | 437/174 |
| 5,317,187 | 5/1994 | Hindman et al. | 257/659 |
| 5,371,042 | 12/1994 | Ong | 437/190 |
| 5,380,678 | 1/1995 | Yu et al. | 437/190 |
| 5,385,867 | 1/1995 | Ueda et al. | 437/195 |
| 5,418,388 | 5/1995 | Okudaira et al. | 257/295 |
| 5,543,357 | 8/1996 | Yamada et al. | 437/192 |

FOREIGN PATENT DOCUMENTS

| | | |
|---|---|---|
| 0387835 A2 | 9/1990 | European Pat. Off. . |
| 0 525 637 A1 | 2/1993 | European Pat. Off. . |
| 0552968 A3 | 7/1993 | European Pat. Off. . |
| 0598422A1 | 5/1994 | European Pat. Off. . |
| 0716447 A2 | 6/1996 | European Pat. Off. . |
| 04 120727 | 4/1992 | Japan . |

OTHER PUBLICATIONS

Shih, et al., "Ti/Ti–N Hf/Hf–N and W/W–N Multilayer Films with High Mechanical Hardness", Applied Physics Letters, vol. 61, No. 6, 10 Aug. 1992, pp. 654–656.

Massiani, et al., "Effect of a Titanium Underlayer on the Corrosion Behaviour of Physically Vapour Deposited Titanium Nitride Films", Thin Solid Films, vol. 217, No. 1/02, 30 Sep. 1992, pp. 31–37.

Wendt, H. et al., "Process Integration for Barrier Layers and Al–Alloys using a Sputtering Cluster Tool", Microelectronic Engineering, vol. 19 pp. 371–374, 1992. (No month avail.).

Maheo, et al., "Microstructure and Electrical Resistivity of TiN Films Deposited on Heated and Negatively Biased Silicon Substrates", Thin Solid Films, vol. 237, No. 1/02, 1 Jan. 1994, pp. 78–86.

Hultman, et al., "Interfacial Reactions in Single–Crystal–TiN(100)/Al/Polycrystalline–TiN Multilayer Thin Films", Thin Solid Films, vol. 215, No. 2, 14 Aug. 1992, pp. 152–161.

Joshi, et al., "Collimated Sputtering of TiN/Ti Liners into Sub–Half–Micrometer High Aspect Ratio Contacts/Lines", Applied Physics Letters, vol. 61, No. 21, 23 Nov. 1992, pp. 2613–2615.

*Primary Examiner*—Bernard Pianalto
*Attorney, Agent, or Firm*—Skjerven, Morrill, MacPherson, Franklin & Friel; Edward C. Kwok

[57] ABSTRACT

A single chamber of a vapor deposition system is used to deposit both Ti and TiN. A Ti layer is deposited on the sample using a noncollimated process. $N_2$ gas is then introduced in the chamber. A TiN layer is then deposited over the Ti layer. A second Ti layer is deposited over the TiN layer. A separate Ti pasting of a TiN chamber is eliminated, thereby increasing throughput. Further, only three physical vapor deposition chambers are used, thereby allowing the fourth chamber to be used for other metal deposition. Moreover, the second Ti layer eliminates the first wafer effect and reduces sheet resistance relative to a same chamber Ti/TiN underlayer. Lastly, the Al deposited on this new stack has a stronger <111> crystallographic texture, which leads to better electromigration resistance.

3 Claims, 3 Drawing Sheets

PROCESS FOR IN-SITU DEPOSITION OF A TI/TIN/TI ALUMINUM UNDERLAYER

FIELD OF THE INVENTION

This invention relates to deposition methods for manufacturing integrated circuits, and particularly, to methods for depositing Titanium (Ti) and Titanium Nitride (TiN) stacks.

BACKGROUND INFORMATION

The results of recent electromigration studies suggest that one candidate for the next generation metal stack is Ti/TiN/Al/TiN. However, manufacturing such a metal stack using conventional processes presents some throughput problems. A typical deposition system for forming metal stacks has four physical vapor deposition chambers. Thus, using a conventional process (where a separate deposition chamber is used for each layer), all four chambers would be used to deposit the stack. FIG. 1 (Prior Art) illustrates this conventional process. In step i, a wafer (also referred to as a "sample") 100 is moved into chamber 110 for Ti deposition. In step ii, wafer 100 is moved into chamber 120 for TiN deposition. In step iii, wafer 100 is moved into chamber 130 for Al deposition. In step iv, wafer 100 is moved into chamber 140 for a second TiN deposition. As a result, the system's throughput is limited because each wafer must be moved in and out of a chamber at least four times to form the Ti/TiN/Al/TiN stack.

Additionally, because all four chambers are utilized for the metallization scheme, the flexibility of the system is greatly reduced. The supported metallization scheme can only involve Ti, Al, and TiN.

Moreover, because the TiN deposition in chamber 120 has a special clamp that leaves large areas on wafer 100 uncovered with TiN, the system of FIG. 1 cannot accommodate TiN/Tungsten barrier depositions because typical barrier depositions must cover most (if not all) of the wafer surface. As a result, the subsequently deposited tungsten will only deposit on TiN and, thus, will adhere to wafer 100. However, if all the chambers used to deposit the Ti/TiN/Al/TiN stack have special clamps, the system cannot be used for these barrier depositions.

Still further, in a conventional process, the TiN chamber requires Ti pasting to prevent TiN from flaking off the interior surface of the chamber. Consequently, Ti pasting further decreases throughput.

FIG. 2 (Prior Art) illustrates an alternative conventional process which utilizes three chambers. In step 1, wafer 100 is moved into chamber 110 for Ti deposition. In step 2, wafer 100 is moved into chamber 120 for TiN deposition. In step 3, wafer 100 is moved into chamber 130 for Al deposition. In step 4, wafer 100 is moved back into chamber 120 for another TiN deposition. Although using only three of the four chambers, this process has limited throughput not only because there are four handling steps (i.e., moving the sample into and out of a chamber), but also because the chambers cannot be used concurrently due to the requirement that chamber 120 be available for the second TiN deposition of step 4.

Copending application "A PROCESS FOR IN-SITU DEPOSITION OF A Ti/TiN BARRIER METAL STACK" Ser. No. 08/347,781 filed on Nov.30, 1994, by Paul R. Besser et al., which is herein incorporated by reference in its entirety, discloses a process for in-situ deposition of a Ti/TiN barrier metal stack that avoids the throughput problems of the conventional processes described in conjunction with FIGS. 1 and 2. Although the process disclosed in copending application Ser. No. 08/347,781 is a great improvement over conventional processes, improvements in mechanical and electrical characteristics, such as uniformity, crystallographic texture, and sheet resistance, of course, are almost always desirable.

SUMMARY

In accordance with the present invention, provided is a method for using a single chamber of a vapor deposition system to deposit three layers comprising Ti, TiN and Ti, and an apparatus for practicing the method.

According to one embodiment of the invention, a Ti layer is deposited on the sample. $N_2$ gas is then introduced in the chamber. A TiN layer is then deposited over the Ti layer. The $N_2$ gas is evacuated from the chamber and a second Ti layer is deposited over the TiN layer, thereby forming a Ti/TiN/Ti underlayer.

Because all three layers (Ti, TiN and Ti) are deposited in the same chamber, the process requires fewer handling steps than the conventional processes illustrated in FIGS. 1 and 2, thereby increasing throughput. Further, the need for Ti pasting of a TiN chamber is eliminated, thereby further increasing throughput. Still further, only three physical vapor deposition chambers are used, thereby allowing the fourth chamber to be used for other metal deposition. Moreover, deposition of the second Ti layer places the target sputter surface in pure Ti or metallic mode, which eliminates Nitrogen incorporation in the subsequently deposited Ti film. As a result, this second Ti layer reduces the sheet resistance of the Ti/TiN/Ti underlayer relative to a same chamber Ti/TiN underlayer.

DETAILED DESCRIPTION

Figure 1:
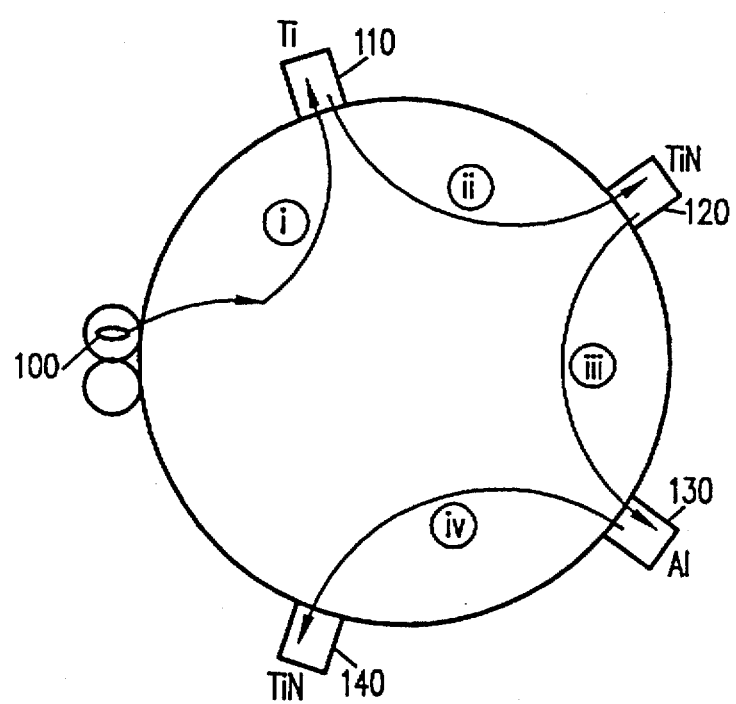
FIG. 1 (Prior Art) illustrates a process flow of a conventional Ti/TiN/Al/TiN process using a separate vapor deposition chamber for each layer.
Figure 2:
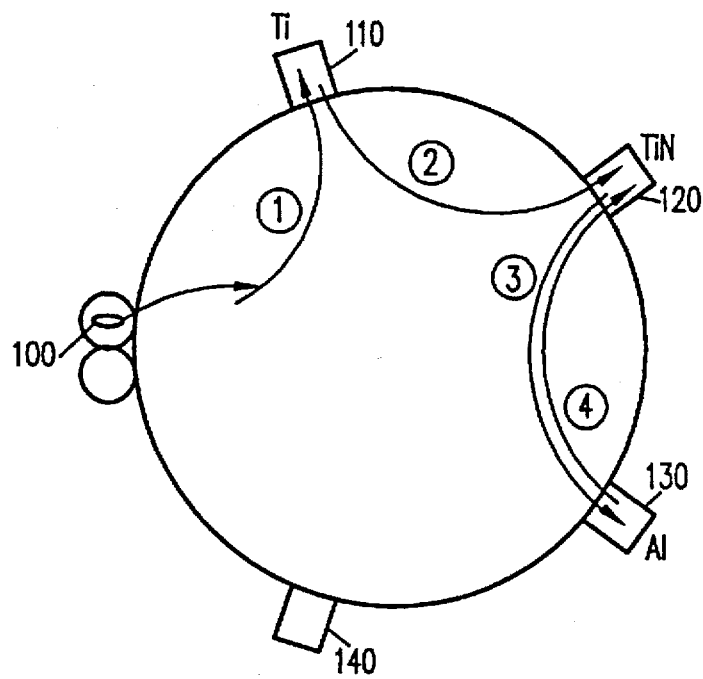
FIG. 2 (Prior Art) illustrates a process flow for an alternative conventional Ti/TiN/Al/TiN process using 3 chambers.
Figure 3:
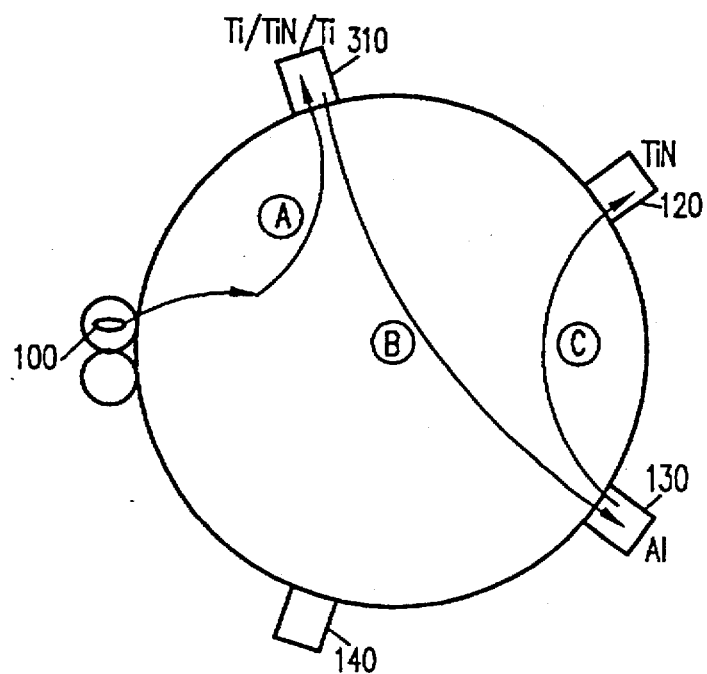
FIG. 3 illustrates the process flow for a single chamber Ti/TiN/Ti deposition using one embodiment of the present invention in a deposition system having four physical vapor deposition chambers.

FIG. 3 illustrates the process flow for Ti/TiN/Ti deposition using one embodiment of the present invention in a deposition system having four physical vapor deposition chambers. In step A, wafer 100 is moved into a chamber 310 for Ti/TiN/Ti deposition. A robot arm (not shown) is used to move wafer 100 into and out of the chambers. In step B, wafer 100 is moved into chamber 130 for another deposition. In this application, chamber 130 is used for Al deposition. In step C, wafer 100 is moved into chamber 120 for another deposition. In this application, chamber 120 is used for TiN deposition. Throughput is increased in the process of FIG. 3 as compared to the processes of FIGS. 1 and 2 because the system of FIG. 3 requires one fewer handling steps. Further, the Ti/TiN/Ti step A is self-pasting because the chamber 310 is pasted by the Ti deposition of the next wafer moved into chamber 310 for Ti/TiN deposition. Still further, a fourth chamber is left available for other metal depositions without disrupting concurrent use of the remaining three chambers.

Figure 4:
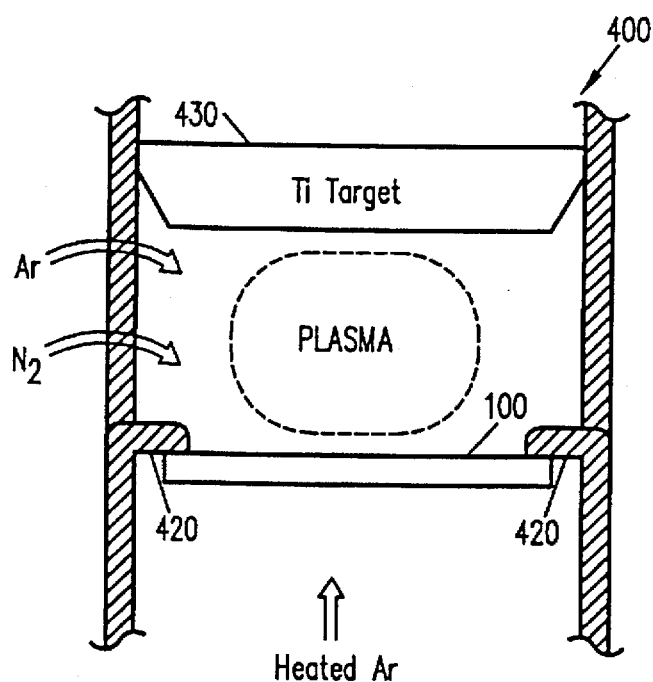
FIG. 4 shows a Ti/TiN/Ti vapor deposition system according to one embodiment of the present invention.

FIG. 4 shows a vapor deposition system 400 according to one embodiment of the present invention using a four physical vapor deposition chamber system, such as the Endura 5500 made by Applied Materials, Inc. Of course, vapor deposition chambers available from other manufacturers may be used instead. In vapor deposition system 400, wafer or sample 100 is held approximately 52 mm from Ti target 430 by a heater clamp 420. For this embodiment, the steps for a typical "same chamber" Ti/TiN/Ti deposition are summarized in Table 1 below.

TABLE 1

| Step | BSP | Pre-heat | Dep | Gas | Dep | Gas | Dep | BSP |
|---|---|---|---|---|---|---|---|---|
| Time (sec) | 2 | 15 | 7.0 | 5.0 | 34 | 5.0 | 7.0 | 4.0 |
| Power (W) | 0 | 0 | 3000 | 0 | 6500 | 0 | 3000 | 0 |
| Power Rate (W/s) | 0 | 0 | 3000 | 0 | 6500 | 0 | 3000 | 0 |
| Gas Flow | | | | | | | | |
| Heated Ar | −2 PV | 15 | 15 | 15 | 15 | 15 | 15 | −2 PV |
| Ar | | 50 | 50 | 34 | 34 | 50 | 50 | −2 PV |
| $N_2$ | | 0 | 0 | 90 | 90 | 0 | 0 | −2 PV |

In the first BSP step, the gas lines for providing various gases to the chamber are closed and the heated Ar gas line is evacuated to the final valve of the gas line to a pressure of approximately $10^{-8}$ Torr (−2 PV). As a result, the chamber is evacuated to a base pressure of approximately $10^{-8}$ Torr. This step takes approximately 2 seconds to complete.

In the Preheat step, sample 100 is placed against the heater clamp 420, and 15 SCCM (standard cubic centimeters per minute) of heated Ar gas is supplied into the chamber below sample 100 to preheat sample 100 and maintain a pressure differential to keep sample 100 in contact with heater clamp 420. In this embodiment, sample 100 is heated to approximately 250° C., but any temperature may be used depending on the step coverage and film quality desired. Typically, a temperature in the range of 25°–450° C. is suitable. A target-to-sample spacing of 52 mm is maintained. This spacing is the optimized spacing for TiN deposition for the power and magnet (not shown) in this process for deposition in an Endura 5500. For other manufacturers' equipment, a different spacing may be used. Ar gas is introduced into the chamber above the sample for generating a plasma. In this embodiment, 50 SCCM of Ar gas is used, although any flow of Ar gas can be used so long as enough Ar gas is provided to create a suitable plasma. Typically, an Ar gas flow in the range of 40–100 SCCM is suitable. This step takes approximately 15 seconds.

In the first Dep step, Ti is deposited on sample 100. A plasma is created in the chamber by applying a voltage across the Ti target 430 and sample 100. In this embodiment, a 3000 W plasma is used, although any power level can be used depending on the sputtering rate and coverage desired. Typically, a power level greater than 1000 W is suitable. A suitable plasma pressure can be anywhere from a few to several hundred mTorr. No collimator is necessary, which if used, would slow down the deposition process thereby reducing throughput. The Ar and heated Ar gas flows are maintained and a 250 Å thick layer of Ti is deposited on sample 100 after approximately 7.0 seconds.

In the first Gas step, the plasma is terminated by terminating the power, and $N_2$ gas is introduced into the chamber. As a result, the sputter surface of Ti target 430 contains titanium nitride (i.e., nitrided-mode) for TiN deposition. In this embodiment, 90 SCCM of $N_2$ flow is used, although any gas flow can be used that provides sufficient N under the existing conditions to place Ti target 430 into nitrided-mode. Typically, a $N_2$ gas flow in the range of 60 and 200 SCCM is suitable. The Ar flow is reduced to a lower value (34 SCCM).

In the second Dep step, TiN is deposited on sample 100. A plasma is created by applying a voltage across the nitrided Ti target 430 and sample 100. In this embodiment, a 6500 W plasma is used because of the lower sputtering rate of TiN (compared to Ti). Again, any power level can be used depending on the sputtering rate and coverage desired. Typically, a power level greater than 5000 W is used to achieve a suitable sputtering rate. The $N_2$, Ar and heated Ar gas flows are maintained and after approximately 34 seconds, 800 Å of TiN is deposited on sample 100.

If the process were stopped at this point, sample 100 would have a stack similar to the same-chamber Ti/TiN stack disclosed in copending application Ser. No. 08/347,781. This Ti/TiN stack is suitable for many applications and represents a great improvement over conventional processes.

Of course, improvements in manufacturability and electrical characteristics are almost always desirable. The same chamber Ti/TiN underlayer disclosed in application Ser. No. 08/347,781 has a first layer effect due to the fact that the Ti deposition on the first wafer is from a metallic Ti target, whereas the Ti depositions of subsequent wafers in the run are from a nitrided-mode target, thereby incorporating N in the Ti layer. Because of the N in the Ti layer, the formation of $TiSi_2$ for gate salicides could be detrimentally affected, leading to higher contact resistance. Further, the N in the Ti layer increases its sheet resistance of and affects the crystallographic texture of the Ti layer.

In the second gas step, the mixture of Ar and $N_2$ gases in the chamber above sample 100 is evacuated and replaced with Ar gas. As in the preheat step, 50 SCCM of Ar gas is introduced above sample 100 for generating a plasma. This step takes approximately 5–10 seconds.

For the Ti/TiN/Ti process, a third deposition step is introduced. In the third Dep step, Ti is deposited on the TiN layer on sample 100. Again, a 3000 W plasma is created in the chamber by applying a voltage across the Ti target 430 and sample 100. The Ar and heated Ar gas flows are maintained at 50 SCCM and 15 SCCM, respectively, and a 250 Å thick layer of Ti is deposited on sample 100 after approximately 7.0 seconds.

Because of the third deposition step, this process is probably longer than the process disclosed in copending application Ser. No. 08/347,781. Thus, this process has a slightly lower throughput. However, after the second Ti deposition, Ti target 430 is placed in the metallic mode, thereby eliminating the first layer effect. Also, the sheet resistance of the Ti/TiN/Ti underlayer is lower relative to the same-chamber Ti/TiN underlayer disclosed in copending application Ser. No. 08/347,781 because the Ti/TiN/Ti underlayer is both thicker and has a lower percentage of N.

As a result, this process is more controllable than the same-chamber Ti/TiN underlayer process. Additionally, this second Ti deposition step serves to paste the interior of chamber 310, which eliminates the need for periodic, separate Ti pasting steps.

For most applications, these advantages outweigh the probable loss of throughput, especially because many applications of this same chamber Ti/TiN/Ti process use the Ti/TiN/Ti stack as an underlayer for a subsequent Al layer deposition. This Al layer deposition typically takes as long or longer than the same chamber Ti/TiN/Ti process of the present invention and, therefore, net throughput may not be affected.

In the final BSP step, the plasma is terminated and the gas lines closed. The Ar and $N_2$ gas lines are evacuated to the final valve of the gas line. Thus, Ti target 430 is left in a metallic mode. This step takes approximately 4 seconds to complete.

Figure 5:
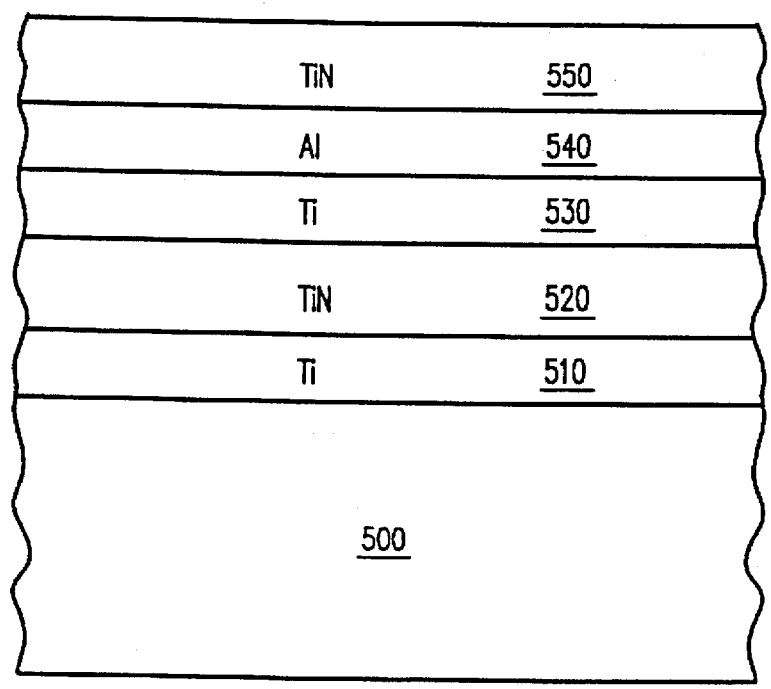
FIG. 5 shows a cross-sectional view of a Ti/TiN/Ti/Al/TiN stack.

FIG. 5 shows a cross-sectional view of a Ti/TiN/Ti/Al/TiN stack produced using the above-described embodiment. First, Ti layer 510 is deposited on sample 500 to a thickness of approximately 250 Å. Second, in the same chamber, TiN layer 520 is deposited on top of Ti layer 510 to a thickness of approximately 800 Å. Third, Ti layer 530 is deposited on top of TiN layer 520 to a thickness of approximately 150 Å. Sample 500 is moved to another chamber where Al layer 540 is deposited on top of Ti layer 530 to a thickness of approximately 4000 Å. In this example, Al layer 540 is a Al-1.0%Cu alloy. Sample 500 is then moved to a third chamber where TiN ARC layer 550 is deposited on Al layer 540.

The observed crystallographic texture of Al layer 540, as determined using x-ray diffraction, is slightly stronger for Al deposited on same chamber Ti/TiN/Ti (volume fraction <111>=0.93 for both as deposited films and annealed films) than for same chamber Ti/TiN with nitrided-mode target (volume fraction <111>=0.92). This higher volume fraction <111> is desirable because the texture gives the Al better electromigration resistance.

Further, the peak width is observed to be 3.9° (3.8° when the stack is annealed), which is tighter than the peak width observed for Al deposited on top of same chamber Ti/TiN with nitrided-mode target (5.8°; 5.6° after annealing). The 3.8° peak width observed for Al deposited on the annealed same chamber Ti/TiN/Ti underlayer is as good as the separate chamber Ti/TiN underlayer.

Also, the observed sheet resistance of the same chamber Ti/TiN/Ti stack is 10.93 Ω/square (as deposited), which is an improvement over the 16.23 Ω/square observed for the same chamber Ti/TiN stack (with nitrided-mode target, as deposited).

The foregoing has described the principles and preferred embodiments of the present invention. However, the invention should not be construed as being limited to the particular embodiments described. For example, the deposition time, temperature, plasma power, gas flows and spacing can be varied to produce Ti or TiN films of different thickness and/or quality at different rates and/or efficiency. Thus, the above-described embodiments should be regarded as illustrative rather than restrictive. Variations can be made to those embodiments by workers skilled in the art without departing from the scope of the present invention as defined by the following claims.

We claim:

1. A method for depositing Ti, TiN, and Ti, said method comprising the steps of:

placing a sample in a single physical vapor deposition chamber, said chamber containing a Ti target;

introducing argon gas into said chamber at a selected flow rate;

depositing Ti on such sample in said chamber, said step of depositing Ti including applying a voltage across said target and said sample to generate a first plasma in said chamber;

terminating said plasma in said chamber by removing said voltage from across said target and said sample;

decreasing said flow rate of said argon gas;

introducing $N_2$ gas into said chamber to form TiN on said target;

depositing TiN, without removing said sample from said chamber, on said Ti deposited on said sample, said step of depositing TiN including generating a second plasma in said chamber;

removing said $N_2$ gas from said chamber; and depositing Ti, without removing said sample from said chamber, on said TiN deposited on said sample; wherein said step of introducing $N_2$ gas comprises the step of introducing 70 to 90 SCCM of $N_2$ gas into said chamber.

2. A method for depositing Ti, TiN, and Ti, said method comprising the steps of:

placing a sample in a single physical vapor deposition chamber, said chamber containing a Ti target;

introducing argon gas into said chamber at a selected flow rate;

depositing Ti on such sample in said chamber, said step of depositing Ti including applying a voltage across said target and said sample to generate a first plasma in said chamber;

terminating said plasma in said chamber by removing said voltage from across said target and said sample;

decreasing said flow rate of said argon gas;

introducing $N_2$ gas into said chamber to form TiN on said target;

depositing TiN, without removing said sample from said chamber, on said Ti deposited on said sample, said step of depositing TiN including generating a second plasma in said chamber;

removing said $N_2$ gas from said chamber; and depositing Ti, without removing said sample from said chamber, on said TiN deposited on said sample, wherein said step of depositing TiN comprises the steps of:

introducing $N_2$ gas into said chamber; and creating a plasma in said chamber between said target and said sample;

wherein said step of introducing $N_2$ gas comprises the step of introducing 70 to 110 SCCM of $N_2$ gas into said chamber; and wherein said step of creating a plasma comprises the step of creating a plasma using at least 5000 W of power.

3. A method for improving the texture of an Al layer deposited on a sample, said method comprising the steps of:

depositing a layer of Ti on a sample in a physical vapor deposition chamber;

depositing a layer of TiN on said Ti layer deposited in said Ti depositing step, said TiN deposition occurring in said physical vapor deposition chamber;

depositing a second layer of Ti on said TiN layer deposited in said TiN depositing step, said second Ti deposition step occurring in said physical vapor deposition chamber;

depositing a layer of Al on said second Ti layer deposited in said second Ti depositing step, whereby the volume fraction of <111> oriented grains of said Al layer is increased; and depositing a second layer of TiN on said Al layer deposited in said Al depositing step, said second TiN layer for serving as an anti-reflective coating.

* * * * *